United States Patent [19]

Edwards

[11] Patent Number: 5,465,053
[45] Date of Patent: Nov. 7, 1995

[54] ELECTRONIC DRIVE CIRCUITS FOR ACTIVE MATRIX DEVICES, AND A METHOD OF SELF-TESTING AND PROGRAMMING SUCH CIRCUITS

[75] Inventor: Martin J. Edwards, Crawley, United Kingdom

[73] Assignee: U.S. Philips Corporation, New York, N.Y.

[21] Appl. No.: 121,651

[22] Filed: Sep. 14, 1993

[30] Foreign Application Priority Data

Sep. 18, 1992 [GB] United Kingdom .................... 9219836

[51] Int. Cl.$^6$ ............................. G01R 31/02; G09G 3/18
[52] U.S. Cl. ................................ 324/770; 345/93
[58] Field of Search ........................... 324/158 R, 158 T, 324/770; 437/8; 359/59; 345/87, 92, 93

[56] References Cited

U.S. PATENT DOCUMENTS

| | | | |
|---|---|---|---|
| 4,820,222 | 4/1989 | Holmberg et al. | 437/8 |
| 5,063,378 | 11/1991 | Roach | 345/90 |
| 5,067,021 | 11/1991 | Brody | 345/206 |
| 5,113,134 | 5/1992 | Plus et al. | 324/158 R |
| 5,162,931 | 11/1992 | Holmberg | 359/59 |
| 5,173,792 | 12/1992 | Matsueda | 359/59 |
| 5,235,272 | 8/1993 | Henley | 324/158 R |
| 5,260,818 | 11/1993 | Wu | 359/59 |

*Primary Examiner*—Ernest F. Karlsen
*Attorney, Agent, or Firm*—Steven R. Biren

[57] ABSTRACT

A shift register or other electronic drive circuit, for an LCD or other active matrix device includes a series of circuit blocks each having redundancy in the form of parallel circuit paths. When the circuit is turned on, self-testing and redundancy selection is carried out by individual test and control arrangements which are associated with the circuit blocks. The test and control arrangements may comprise memory elements, such as a bistable, which electrically program themselves in response to their electrical testing of the circuit paths so as to generate a control signal at an output coupled to one or more output switches. The output switches control which of the parallel circuit paths provides an output to the active matrix device. Each test and control arrangement also comprises a routing circuit controlled by the control signal, for transmitting the correct serial output of that circuit to all serial inputs of a next circuit block.

15 Claims, 4 Drawing Sheets

ELECTRONIC DRIVE CIRCUITS FOR ACTIVE MATRIX DEVICES, AND A METHOD OF SELF-TESTING AND PROGRAMMING SUCH CIRCUITS

BACKGROUND OF THE INVENTION

This invention relates to electronic drive circuits for an active matrix device (for example, a liquid crystal display), comprising circuit blocks each having redundancy in the form of parallel circuit paths, and further relates to a method of self-testing and programming such circuits. The invention relates particularly, but not exclusively, to the provision of redundancy in a shift register for such an active matrix device, and the circuit may be composed of thin-film circuit elements formed on an insulating substrate of the active matrix device.

The integration of a drive circuit for an active matrix device onto the device substrate offers a number of advantages over the more conventional approach of providing external connections from the active matrix device to separate drive circuits in the form of conventional silicon integrated circuit chips. These advantages include a more compact device, a reduced complexity of electrical interconnection and a possibility of reduced manufacturing cost. If the drive circuit is fabricated using thin-film circuit technology compatible with that used to make the active matrix device, then the drive circuit could in principle be produced on the device substrate at little or no additional cost. However, this assumes that the drive circuit integration does not significantly affect the yield of working devices. A fault in the drive circuits (such as a short or open circuit) could result in otherwise good devices having to be rejected. This problem is particularly acute for a shift register which forms one of the main elements of conventional row or column drive circuits.

With such a conventional row drive circuit, the active matrix is scanned by feeding a pulse into the input of the shift register. This input pulse must pass correctly through all the stages of the shift register in order for the drive circuit to operate correctly. A fault within one register stage will result in all of the following stages producing incorrect shift outputs. It is therefore important that the register should be free of faults. This problem is considered in U.S. Pat. No. 5,063,378, the whole contents of which are hereby incorporated herein as reference material.

The electronic drive circuit proposed in U.S. Pat. No. 5,063,378 is divided into a series of circuit blocks, each block having redundancy in the form of parallel circuit paths which provide alternative routing through the block. The circuit also comprises a switch for selecting from each block which of the parallel circuit paths is to be used to provide an output from that block. The blocks in the circuits of U.S. Pat. No. 5,063,378 comprise only a single stage of the shift register, and the switch is a combiner circuit coupled between the blocks to control which serial output of the parallel circuit paths of each stage of the register is transmitted to the next stage of the register. That U.S. patent does not describe how the combiner circuit or driver circuit may prevent the scanning signal from both parallel registers appearing on the row conductor. The parallel paths may be on one side of the active matrix or, for example, on opposite sides of the matrix. The active matrix device of U.S. Pat. No. 5,063,378 is a liquid crystal display (LCD).

After manufacture of the LCD array with all its circuitry, the drive circuit of U.S. Pat. No. 5,063,378 is tested by sequentially activating each successive row of the active matrix using one (first) of the shift register paths. If a fault is detected in a stage of this first shift register path, the combiner circuit coupled to the output of the defective stage has then to be reconfigured to route the scanning signal from the corresponding stage of the parallel (second) shift register path to the next stage of the first shift register path. This is carried out as a final stage in the manufacture of the device. In most cases the combiner circuit is reconfigured by breaking a fusable link with a laser beam. However, accurate positioning of the laser beam on the link is required to reconfigure the combiner circuit in this way, otherwise adjacent parts of the circuit may be damaged. It is also suggested in U.S. Pat. No. 5,063,378 that the use of a laser can be avoided by applying instead a special potential to one or more inputs of the combiner circuit so as to condition the combiner circuit to reroute the scanning signal.

Although the provision of shift register redundancy in this manner provides a considerable improvement in the yield of working displays, further significant improvements can be made by adopting in accordance with the present invention a different approach to the testing and control of the redundancy.

SUMMARY OF THE INVENTION

According to the present invention there is provided an electronic drive circuit for an active matrix device, comprising circuit blocks each having redundancy in the form of parallel circuit paths which provide alternative routing through the block, and a switch for selecting from each block which of the parallel circuit paths is to be used to provide an output from that block. Such an electronic drive circuit in accordance with the present invention is characterised in that it also comprises, coupled to the parallel circuit paths, a test and control arrangement which takes an input from a parallel circuit path and has a test signal input for electrically testing the parallel circuit path, and in that the test and control arrangement, in response to its electrical testing, electrically switches itself to generate a control signal at an output coupled to the switch for controlling which of the parallel circuit paths is used to provide an output for the active matrix device.

Thus, whereas the redundancy control scheme of U.S. Pat. No. 5,063,378 required external testing of the display (involving optical measurements and/or external electrical measurements via probes) to determine which fusable links to break (either electrically or with a laser), the present invention integrates with the drive circuit a test and control arrangement which takes inputs from the parallel circuit paths. The testing of the drive circuit is carried out within the circuit by using the test signal applied to the other input of the test and control arrangement. The drive circuit thus has a self-testing capability. In response to its own electrical testing, the test and control arrangement then switches itself to provide an output to the switch for controlling the outputs to the active matrix device.

Self programming of the test and control arrangement can be readily achieved by including within the test and control arrangement a simple memory element, such as, for example, a latch, which is switched from one memory state to another memory state in response to its own electrical testing of the parallel circuit paths. The state of this memory element then controls which circuit paths and outputs are used during the subsequent normal operation of the circuit.

By applying appropriate test signals, the test and control arrangement in accordance with the present invention permits the detection (and avoidance by re-routing) of most types of defects, and possibly even all types of defects which can arise in such a drive circuit. Such defects are, for example, an output signal which is always high or always low, or an output signal which is inverted, or a signal resulting from a short circuit to a clock line.

Furthermore, the self testing and programming provided in accordance with the present invention can be carried out each time the active matrix drive circuit is turned on and will therefore correct for a defect which may develop within the circuit during the working life of the active matrix device. This feature is particularly advantageous because the applicants find that defects in the drive circuit may result not only as a fault produced in manufacture, but the defects may also result from the operation of the circuit, for example, as a short-circuit or open-circuit or a degradation of transistor characteristics as a result of sustained high bias voltages and currents in the drive curcuit. Thus, self-testing and reprogramming of the redundancy each time the circuit is turned on can be of particular benefit for prolonging the working life of the drive circuit. The electronic drive circuit may thus be connected to, or integrated with, for example, a pulse generator which generates program pulses for controlling the turn on of the circuit. These pulses may comprise sequences of test pulses applied to the circuit blocks and to the test and control arrangement for testing each successive block and thereby to electrically program the test and control arrangement for each block so as to select which of the parallel circuit paths is used to provide outputs from the circuit blocks when turn on of the circuit is complete. The present invention therefore also provides a method of self-testing and programming the drive circuit in this manner during turn on.

The manner in which the test and control arrangement is provided and organised in accordance with the present invention in relation to the circuit blocks and the switch is particularly convenient for a shift register redundancy scheme. Thus, in one embodiment of the drive circuit in accordance with the invention, a series of the circuit blocks may form a shift register along which a scanning pulse is propagated to provide scanning signals at a succession of parallel shift outputs of the register, the parallel circuit paths of each block having at least one shift output and having a serial input and serial output for the scanning pulse. In accordance with the present invention such a circuit may be further characterised in that each block has its own test and control arrangement coupled to the serial output of the respective block, and the shift output of each stage of the register has its own switch coupled to the test and control arrangement of the respective block.

The test and control arrangement may also comprise a routing circuit which takes as inputs the serial outputs of the preceding block and also the control signal in order to determine whether the serial output of the first or second circuit path is to be transmitted to the serial input of a next block. The routing circuit may be such as to invert the serial output in its transmission.

In the case of a shift register, each circuit block may comprise a succession of stages of tile shift register and so may have a corresponding succession of switches and shift outputs from its circuit paths. Each test and control arrangement may be designed to test and program more than two alternative parallel paths through its block.

BRIEF DESCRIPTION OF THE DRAWINGS

These and other features in accordance with the present invention are illustrated specifically in embodiments of the invention now to be described, by way of example, with reference to the accompanying drawings, in which.

DETAILED DESCRIPTION OF THE PREFERRED EMBODIMENT

Figure 1:
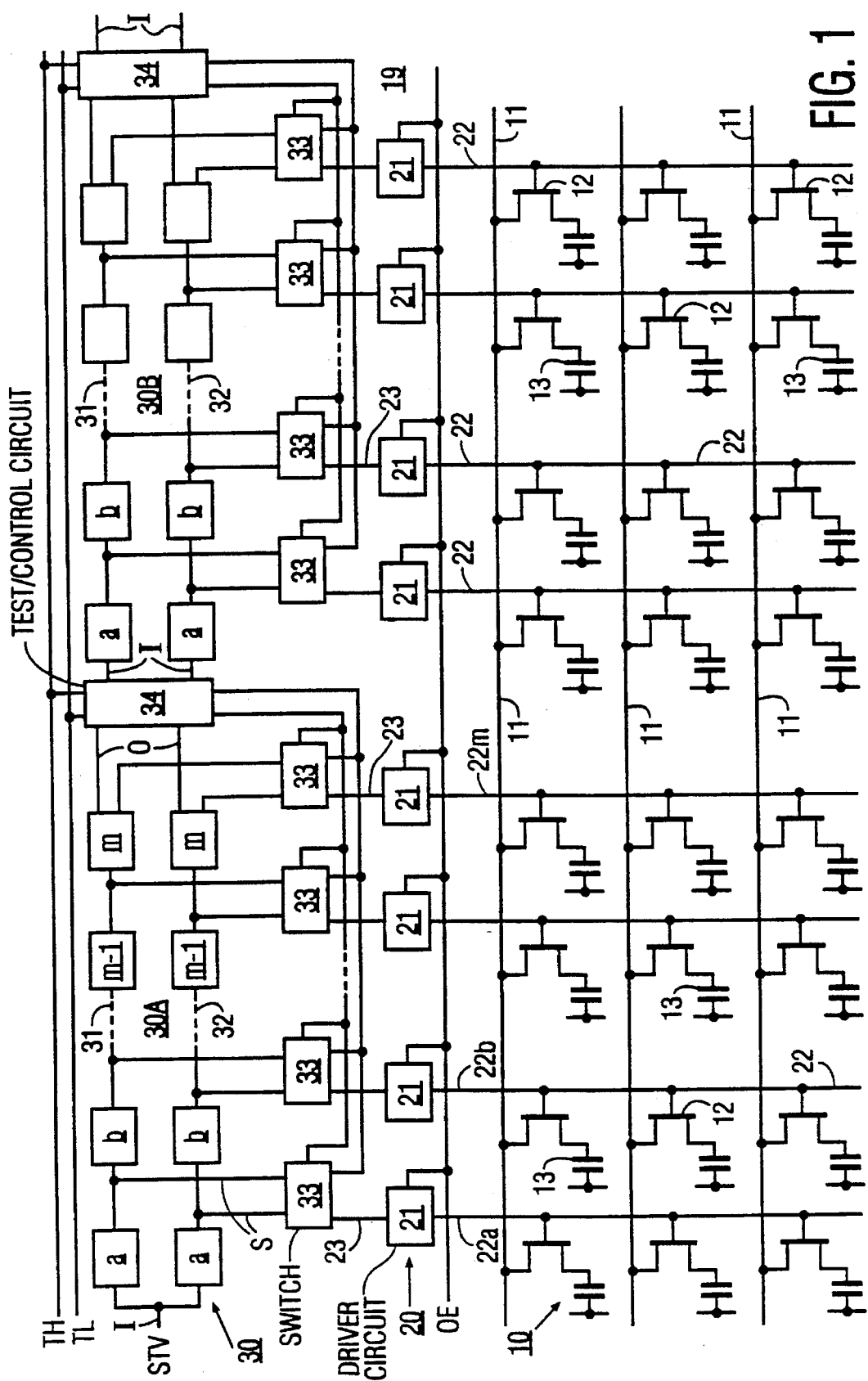
FIG. 1 is a block diagram of an electronic drive circuit comprising a shift register which is constructed in accordance with the present invention and serves to scan an active matrix device.

FIG. 1 illustrates the organisation and integration of a drive circuit 20, 30 on an insulating substrate 19 of an active matrix device. The provision of redundancy testing and control in accordance with the present invention permits good manufacturing yields to be obtained, even through the device circuit 20, 30 is integrated on the same substrate 19 as the active matrix 10 of the device, and can also prolong the working life of the device as will be described later. In this example of an embodiment of the present invention, the active matrix 10 is addressed in a conventional manner via row and column lines 22 and 11, respectively. The drive circuit 20, 30 provides a conventional drive arrangement for the row lines 22. A drive circuit for the column lines 11 may also be integrated on the same substrate 19 and may also include redundancy testing and selection in accordance with the present invention.

The active matrix device may be, for example, a liquid crystal display (LCD) or any other flat panel display device. The active matrix 10 comprises an array of thin-film switching elements 12 which are integrated with the thin-film row and column lines 22 and 11 on the substrate 19. The substrate 19 may be of a low cost glass forming a back plane of the display. The switching elements 12 are addressed in known manner by the signals on the lines 22 and 11 so as to control pixel elements 13 of the display.

However, instead of being a flat panel display, the active matrix device of FIG. 1 may be designed for a quite different function, for example, an image sensor having a matrix of thin-film switching elements 12 for addressing an array of thin-film image sensing elements (for example, photodiodes) and which is driven by associated circuitry 20, 30 etc. In another form the active matrix 10 may be a data store comprising thin-film switching elements 12 which address an array of storage devices, for example, thin-film capacitors 13.

The individual circuit elements and connection lines of the matrix 10 and drive circuit 20 and 30 may be formed in known manner, by depositing on the substrate 19 a succession of films of various materials (for example, conductors, insulators, semiconductors, semi-insulators), the films being processed (for example by etching and doping) to form the various regions and patterns of the circuit elements and their connections.

Any one of a variety of thin-film device technologies may be used to fabricate on the substrate 19 the circuit elements and connections of the active matrix 10 and drive circuit 20, 30. Thus, the switching elements 12 of the matrix 10 and circuit elements of the drive circuit 20, 30 may be thin-film transistors (TFTs); and they may be formed using, for example, TFT technology such as that described in U.S. Pat. No. 5,063,378. However, the switching elements 12 of the matrix 10 may be thin-film diodes (TFDs), and a mixed thin-film technology such as, for example, the TFD and TFT technology described in copending United Kingdom patent application 9206086.2, which corresponds to U.S. application Ser. No. 08/260,502, filed Jun. 15, 1994, may be used to form TFDs for the matrix 10 and TFTs for the drive circuit 20, 30. The whole contents of GB 9206086.2 are hereby incorporated herein as reference material.

The drive circuit 20, 30 of FIG. 1 comprises an output driver section 20 which drives the matrix row lines 22 with scanning signals in the form of a pulse from parallel shift outputs 23(S) of a shift register section 30. Each scanning output line 23(S) has its own output driver circuit 21. The circuit 21 buffers the scanning pulse received on the line 23 and, by means of a signal OE, adjusts the timing of the pulse as transmitted to the line 22. The circuits 21 may be of known form and so will not be described nor illustrated further.

The shift register section 30 is divided into a series of circuit blocks 30A, 30B, etc. Each block has built-in redundancy in the form of parallel circuit paths 31 and 32 which provide alternative routing through the block. In the example of FIG. 1, each block 30A, 30B etc. comprises a succession of stages a, b, . . . , m of the shift register 30, and each parallel path 31a, 31b, . . . , 31m has a corresponding succession of parallel shift outputs S. There may be, for example, up to about 20 such stages in each block 30A, 30B etc. Each block also has a serial input I and a serial output for a scanning pulse STV which is propagated along the register 0 at a clocking frequency appropriate for the scanning rate of the active matrix 10. For clarity in the drawings, the power supply and clock connections of the register 30 are not shown, and the circuit is illustrated simply in block form in FIGS. 1 and 2.

In accordance with the present invention, self-testing and redundancy selection is provided in the shift register 30 by both dividing and repeating in this manner the sections of the register and by including small test and control circuits 34 to test the various sections and automatically to select working sections for the re-routing of the shift register signals.

Each block 30A, 30B etc. of the register 30 has its own test and control arrangement 34 coupled to the serial output 0 of the respective block. The shift outputs S of each stage a, b, . . . , m of each block have individual switches 33 which are coupled to the test and control arrangement 34 of the respective block 30A, 30B etc. As shown more clearly in FIGS. 2 and 6, the test and control arrangement 34 of each block has test signal inputs TH and TL and inputs IA(NS) and IB(NS) from the parallel circuit paths 31 and 32 of that block for electrically testing each parallel circuit path 31 and 32. Each circuit arrangement 34 comprises a memory element such as a flip-flop or latch. In response to its electrical testing, the test and control arrangement 34 electrically programs itself by setting or resetting its memory element to generate a control signal AOK, BOK. This control signal AOK, BOK at an output coupled to the associated switches 33 serves for controlling which of the parallel circuit paths 31 and 32 is used to provide the shift outputs on line 23 for scanning the rows 22 of the active matrix 10. As shown more clearly in FIGS. 2 and 7, the test and control arrangement 34 also comprises a routing circuit 34b which takes as inputs IA and IB the serial outputs O(NS) of the preceding block 30A and also the control signal AOK, BOK to determine whether the serial output of the first or second circuit path 31 or 32 is transmitted to the serial input I of the next block 30B.

Figure 2:
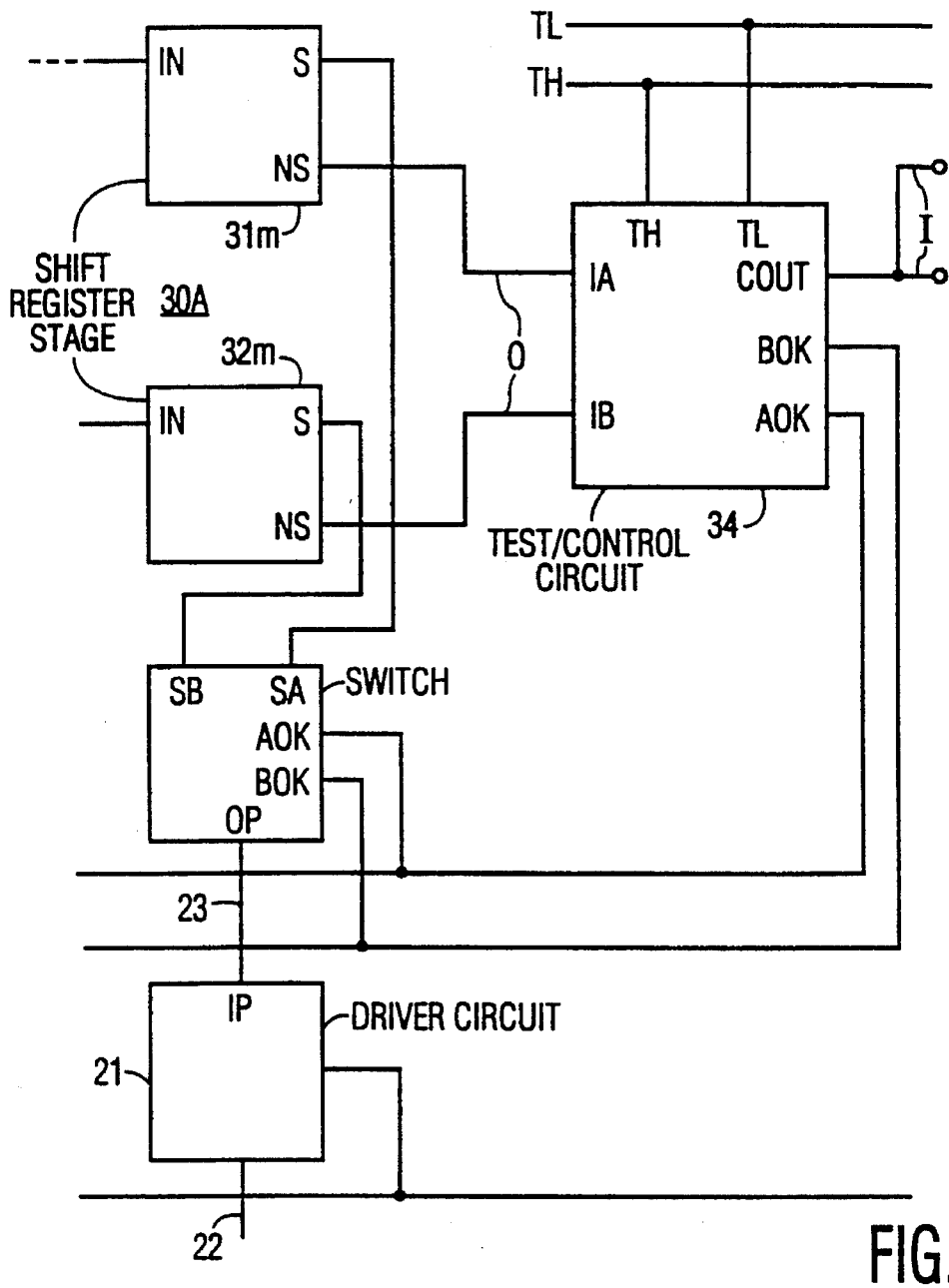
FIG. 2 is a block diagram of a test and control arrangement and switch, at serial outputs of a final register stage of one of the shift register blocks of the circuit of FIG. 1.

Detailed examples of the circuits which may be constructed with n-channel TFTs to form the circuit blocks of the shift register section 30 of FIGS. 1 and 2 are illustrated in FIGS. 3 to 7. It will be evident that these circuits may all be formed readily with thin-film circuit elements (especially TFTs) on the device substrate 19.

Figure 3:
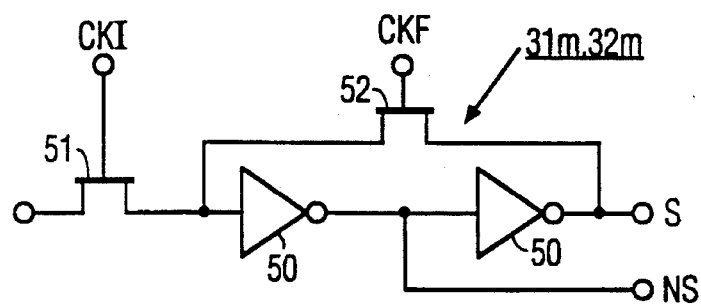
FIG. 3 is a block diagram of one example of one circuit path in the final register stage of FIG. 2, which example comprises two inverters.
Figure 4:
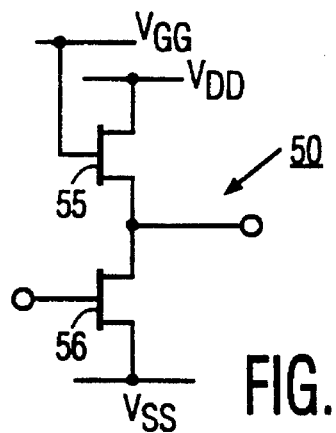
FIG. 4 is a circuit diagram of one example of an inverter suitable for use in the shift register of FIG. 1 and in the register stage of FIG. 3.

FIG. 3 illustrates an example of the final stage m of either the first or second parallel path 31 or 32 of one block 30A of the shift register. Each register stage in this example comprises two inverters 50 in series and has an input pass TFT 51 clocked by a signal (CKI in FIG. 3) and a feedback pass TFT 52 clocked by a signal (CKF in FIG. 3). A suitable arrangement of TFTs 55 and 56 forming each inverter 50 is illustrated in FIG. 4. Two non-overlapping clock signals CKI and CKF may be used to clock input pulse STV through the successive stages a, b, . . . , m, but it should be noted that in alternate stages the connections of the TFTs 51 and 52 to the clocks CKI and CKF are reversed; thus, in the stage (m−1), clock CKF is connected to TFT 51 and clock CKI is connected to TFT 52. Each stage a, b, . . . , m of each path 31 and 32 of the register 30 has a serial output S taken from the second inverter 50, and it is this output S which passes to the output switches 33. However, the last stage m of each block 30A, 30B etc. also has an inverted serial output NS which is taken from the first of the two inverters 50 and which is passed to the test and control arrangement 34 of that block. The test and control arrangement 34 inverts this signal NS in its transmission to the next block.

Figure 5:
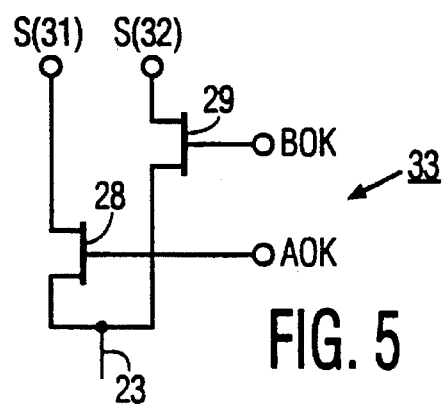
FIG. 5 is a circuit diagram of one example of a switch suitable for use in the circuit of FIGS. 1 and 2.

As illustrated in FIG. 5, each output switch 33 may simply consist of two TFTs 28 and 29 respectively coupled to the outputs S of the first and second circuit paths 31 and 32. The gates of the TFTs 28 and 29 are controlled by the signals BOK and AOK which are generated by the test and control arrangement 34. During operation the signals AOK and BOK are at opposite logic levels so that only one of the two TFTs 28 and 29 is turned on and so the output signal S of only one of the register paths 31 and 32 is passed on the output line 23 to the output driver circuit 21.

Figure 6:
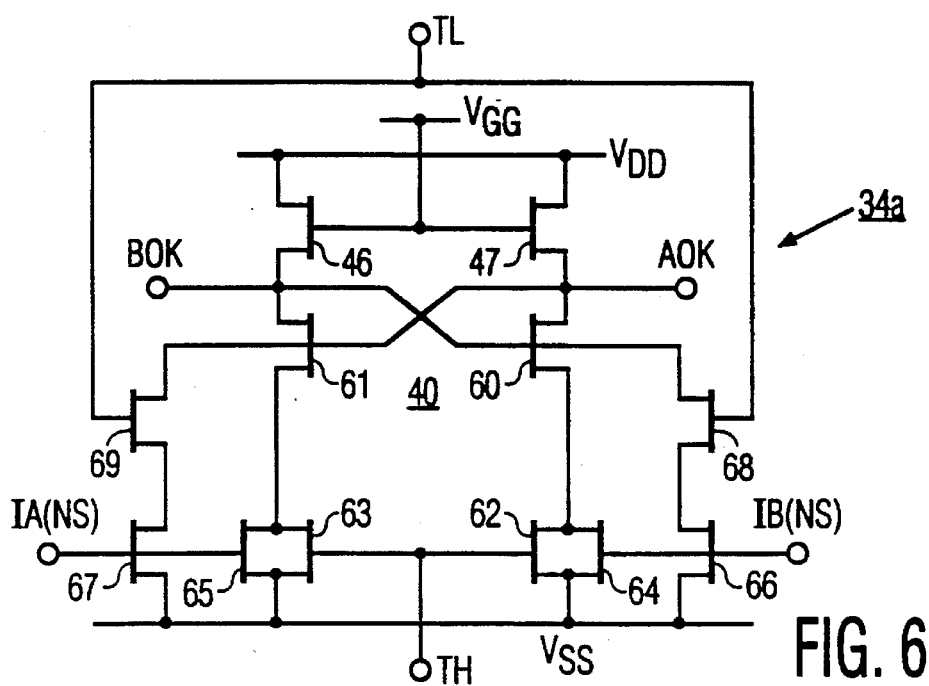
FIG. 6 is a circuit diagram of one example of a testing and storage circuit suitable for use in the test and control arrangement of FIG. 2.
Figure 7:
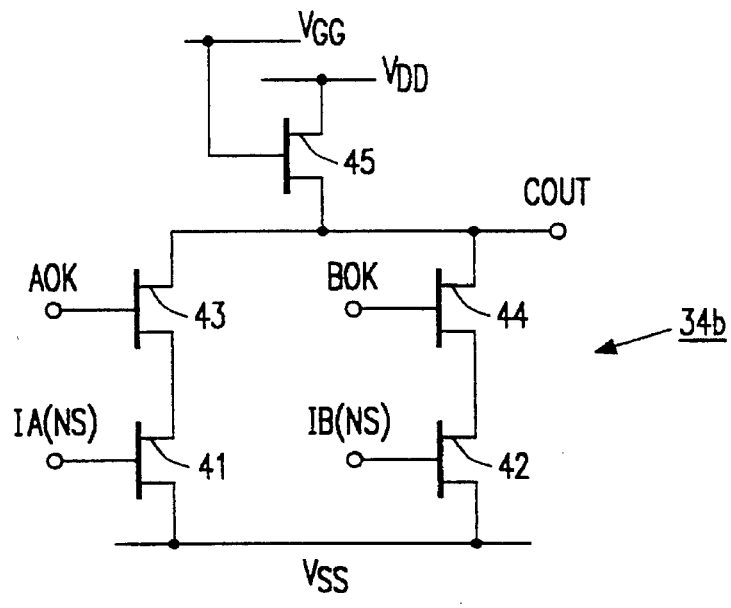
FIG. 7 is a circuit diagram of one example of a routing circuit suitable for use in the test and control arrangement of FIG. 2.

The test and control arrangement 34 of each block 30A, 30B etc. may comprise a testing and storage circuit 34a as illustrated in FIG. 6 and a routing circuit 34b as illustrated in FIG. 7. The transmission gate 34b is a simple signal switching circuit of TFTs 41 to 44 with a common load TFT 45. The gate 34b takes inputs IA and IB from the inverted outputs NS of the last stage m of the preceding block, and is controlled by the two signals AOK and BOK of opposite logic levels generated by the testing and storage circuit. Depending on the respective logic levels of the control signals AOK and BOK, the carry output COUT which is transmitted to the next block 30B is determined either by the input IA from the circuit path 31 or by the input IB from the circuit path 32. The testing and storage circuit 34a may comprise a bistable having a circuit configuration of TFTs 60 to 69, 46 and 47 as illustrated, for example, in FIG. 6. The circuit 34a takes inputs IA and IB from the inverted outputs NS of the last stage m of the preceding block and is controlled by the test signals TL and TH which are applied to all the test and control arrangements 34 of the register section 30. TL applies a high logic level pulse to the circuit, whereas TH applies a low logic level pulse. The bistable 60 to 69 of FIG. 6 is set or reset depending on the state of the two inputs IA and IB when one or other of the two test control signal pulses TL and TH is applied. The bistable generates as its outputs the two signals AOK and BOK of opposite logic levels.

Figure 8:
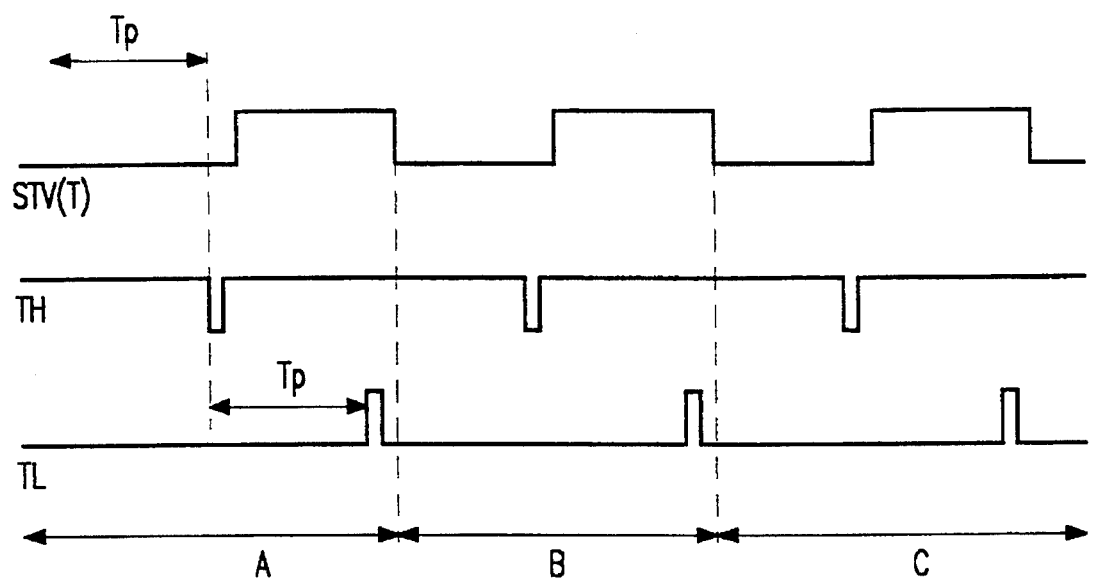
FIG. 8 is one example of a sequence of program pulses suitable for controlling the turn on of the drive circuit of FIG. 1.

FIG. 8 illustrates an example of sequences of test pulses STV(T), TH and TL which may be used for self-testing and redundancy-selection during turn on of the shift register section 30 in a method in accordance with the invention. Thus, a pulse generator which generates program pulses for controlling the turn-on of the drive circuits 20, 30 and the active matrix 10 is connected to the circuit 30 and may even be integrated on the device substrate 19. Thus, as the device is being turned on, it enters a self-testing mode firstly to determine which of the circuit paths 31 and 32 of which blocks 30A, 30B etc. are working and which are faulty and secondly to set or reset the bistable memory element (FIG. 6) of each test and control arrangement 34 so as to select the working paths. The exact procedure for this testing depends on the specific circuit designs adopted, but one possible sequence is illustrated in FIG. 8.

In FIG. 8 the time duration A corresponds to the time spent testing the first circuit block 30A and selecting its redundancy, time duration B is the subsequent corresponding time spent on block 30B, etc. Thus, each of the circuit blocks 30A, 30B 30C etc. is tested and programmed in sequence.

At the start of the test period A the input STV(T) to the shift register stages 31a, 31b, . . . , , 32a, 32b, . . . , of the first block 30A is taken low. It is held at this low level for a period Tp which is greater than the time taken for a signal to be clocked through the complete register 30. The test control input TH is then taken low for a short period. The low level on TH causes the testing and storage circuit 34a (FIG. 6) to test the output NS of the shift register path 31 or 32 which its memory element currently selects. The low level signal TH on the gates of TFTs 62 and 63 turns off these TFTs 62 and 63, and so the state of the bistable BOK and AOK levels is determined by the input signal IA or IB from the serial output NS of the block. If, for example, signal AOK is in the high state indicating that register path 31 is selected, then input IA from path 31 is tested. If the level of IA is low due to a fault in register path 31 then the memory element is automatically reset, so selecting register path 32. Thus, if IA is low no current can flow through TFT 65; because TFT 63 is off, then the voltage at BOK must rise because of the pullup TFT 46. The rise of BOK turns on TFT 60, and so current flows through TFT 64 and AOK thus goes low. If the level of IA is high then register path 31 may be working correctly, or alternatively there may be a fault in register path 31 which results in a high carry signal NS; in either case the state of the memory element remains unchanged. The input STV(T) is then taken high, and after a period Tp the testing and storage circuit 34a (FIG. 6) is again activated, this time by taking TL high for a short period. Taking TL high causes TFTs 68 and 69 to be turned on. The register output which is tested is again determined by the state of the memory element. For example, if the signal AOK is in the high state, then input IA from path 31 is tested. If input IA is high due to a fault, then the memory element is automatically reset so that it then selects input IB from register path 32. If the input IA is low, then the register path 31 is functioning correctly and the state of the memory element is not changed.

In the scenario as described in the preceding paragraph, register path 31 was tested and the memory element was reset if the path 31 failed the test. Such a failure results in register path 32 being selected. However, if it had been register path 32 which was tested, then the memory element would have been reset if a fault was detected so that register path 31 would then be selected.

Each block 30A, 30B, 30C etc. is tested in turn in this way to set up all the register paths through the shift register section 30. During period A the first block 30A is tested, during period B the second block 30B is tested etc. Although all of the test and control arrangements 34 operate during each test period A,B,C etc., a fault in one block will be detected by all the following test and control arrangements 34 because the error in the carry signal will propagate through the shift register 30. It is for this reason that it is necessary to repeat the test cycle for each block 30A, 30B etc. in its turn. When the testing is completed, TH and TL are then held at their inactive levels, and the device is then operated normally with regular pulses STV being applied to the input I of the first stage 31a, 32a.

Because this self-testing and redundancy selection occurs each time the device is turned on, this arrangement in accordance with the invention will also correct (when next the device is turned on) for defects developing within the circuits during the life of the device. This prolongs the working life of the device.

It will be evident that many variations and modifications are possible within the scope of the present invention. Thus, for example, in a modified test program, the clock lines CKI and CKF may be kept to a high logic level during the test sequence so that the test signal STV(T) propagates faster through the shift register. Thus, the period Tp may be reduced in this way to the propagation delay through the register. Although only n-channel TFTs have been illustrated in FIGS. 3 to 7, circuits having the same functions may be constructed in CMOS TFT technology In order to reduce the risk of defects and faults in the parallel circuit paths of the blocks 30A, 30B etc., it may be advantageous to reduce the number of register stages in each block and/or to increase the number of parallel circuit paths. If desired, one or more of the parallel circuit paths 31 and 32 may be located on the opposite side of the active matrix 10. In any event, it is advantageous to separate the parallel circuit paths by a sufficient distance that a single defect (e.g. resulting from a speck of dust) is unlikely to affect more than one of the parallel paths.

Instead of inputting an inverted serial output NS into the test and control arrangement 34, a non-inverted output S taken from the second inverter 50 of FIG. 3 may be used, in which case a non-inverting routing circuit may be used.

In the specific embodiment described above, there are only two parallel register paths 31 and 32 which can be used to provide an output of each block 30A, 30B etc. Only one of the two paths (e.g. path 31) needs to be tested. The tested path 31 is used for device operation if this path 31 passes the test. If the tested path 31 fails the test, then the other path 32 is selected for use and this other path 32 need not be tested. In this situation when a bistable circuit is used to program a memory state of the test and control arrangement 34 to generate a control signal AOK, BOK, then the bistable circuit can be designed so that it always starts in the one state which corresponds to testing of the path 31.

In the embodiments described above, test signal STV(T) is applied through the shift register 30 and test signals TH and TL are applied to the test and control arrangements 34 from outside the shift register 30; and these signals STV(T), TH and TL are applied when the device is turned on. In this case, tile test and control arrangement 34 sets its internal memory state so as to program which path 31 or 32 is to be used during the duration of the period of operation until the device is turned off. However, in an alternative arrangement, all the test signals applied to a test and control arrangement 34 may be taken from within the shift register 30, not only when the device is turned on but also continuously during operation of the device.

Although particularly advantageous for a shift register, the present invention may be used for self-testing and redundancy selection in other drive circuit configurations for an active matrix device. Thus, for example, the output driver section 20 of FIG. 1 may comprise the largest TFTs in the drive circuit 20, 30. Rerouting in accordance with the present invention may be used to avoid defects in these large TFTs. Thus, each output driver circuit 21 may comprise parallel circuit paths which provide alternative routing through each circuit block 21 in accordance with an individual test and control arrangement for each block 21. When the circuit 20, 30 is turned on, the test and control arrangements test the parallel circuit paths and may electrically program an individual memory element for each block 21 to control which path is used to provide the output to the row line 22.

From reading the present disclosure, other variations and modifications will be apparent to persons skilled in the art. Such variations and modifications may involve equivalents and other features which are already known in the design, manufacture and use of drive circuits for active matrix devices and component parts thereof, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

What is claimed is:

1. An electronic drive circuit for an active matrix device comprising:

a plurality of circuit blocks each having a block output for supplying an output signal for the active matrix device, at least first and second parallel circuit paths in each circuit block to provide redundancy by alternative routing through the circuit block, an output switch connecting the parallel circuit paths of each circuit block to its respective block output for selecting which of the parallel circuit paths provides the output signal from the circuit block, a test and control arrangement coupled to the circuit blocks by a circuit path input from one of the parallel circuit paths and via a control output to said output switch, the test and control arrangement having a test input for a test signal for electrically testing at least one parallel circuit path of the circuit block, an internal switch responsive to the electrical testing for electrically switching the test and control arrangement so as to generate a control signal at said control output thereby to select, via the output switch, which of the parallel circuit paths is to provide at the block output the output signal for the active matrix device.

2. The drive circuit as claimed in claim 1, wherein a series of the circuit blocks are coupled to together to form a shift register along which a scanning pulse is propagated to provide scanning signals at a succession of parallel shift outputs of the register, and the parallel circuit paths of each circuit block have at least one shift output and have a serial input and serial output for the scanning pulse, wherein each circuit block has its own test and control arrangement coupled to the serial output of the respective circuit block, and the shift output of each stage of the shift register has its own output switch coupled to the test and control arrangement of the respective circuit block.

3. The drive circuit as claimed in claim 2, wherein each circuit block comprises a succession of stages of the shift register and so has a corresponding succession of output switches and shift outputs from its circuit paths.

4. The drive circuit as claimed in claim 2, wherein the test and control arrangement also comprises a routing circuit which takes as inputs the serial outputs of the preceding block and also said control signal thereby to determine whether the serial output of the first or second parallel circuit path is to be transmitted to a serial input of a next circuit block.

5. The drive circuit as claimed in claim 4, wherein each stage of the shift register comprises two inverters in series, in that the serial output taken from each circuit block to the test and control arrangement is taken from the first of the two inverters in final stage of the circuit block, and wherein the routing circuit inverts the serial output of the circuit block in transmission to the serial input of the next circuit block.

6. The drive circuit as claimed in claim 1, wherein each circuit block has first and second current paths to provide the redundancy, and the test and control arrangement comprises a bistable which is set in response to a change which occurs in the outputs of the first and second circuit paths when tested by the test and control arrangement.

7. The drive circuit as claimed in claim 1, wherein the circuit blocks, the output switch, and the test and control arrangement comprise thin-film circuit elements formed on an insulating substrate of the active matrix device and provide a driving circuit for scanning rows of the matrix.

8. The drive circuit as claimed in claim 7, wherein the active matrix device comprises a liquid crystal display.

9. The drive circuit as claimed in claim 3, wherein the test and control arrangement also comprises a routing circuit which takes as inputs the serial outputs of the preceding block and also said control signal thereby to determine whether the serial output of the first or second parallel circuit path is to be transmitted to a serial input of a next circuit block.

10. The drive circuit as claimed in claim 2, wherein each circuit block has first and second current paths to provide the redundancy, and the test and control arrangement comprises a bistable circuit which is set in response to a change which occurs in the outputs of the first and second circuit paths when tested by the test and control arrangement.

11. The drive circuit as claimed in claim 3, wherein each circuit block has first and second current paths to provide the redundancy, and the test and control arrangement comprises a bistable circuit which is set in response to a change which occurs in the outputs of the first and second circuit paths when tested by the test and control arrangement.

12. The drive circuit as claimed in claim 4, wherein each circuit block has first and second current paths to provide the redundancy, and the test and control arrangement comprises a bistable which is set in response to a change which occurs in the outputs of the first and second circuit paths when tested by the test and control arrangement.

13. The drive circuit as claimed in claim 5, wherein each circuit block has first and second current paths to provide the redundancy, and the test and control arrangement comprises a bistable circuit which is set in response to a change which occurs in the outputs of the first and second circuit paths when tested by the test and control arrangement.

14. The drive circuit as claimed in claim 10 wherein the output switch for each shift output comprises a first selection switch for selecting the shift output of the first circuit path and a second selection switch for selecting the shift output of the second circuit path, and the bistable circuit has first and second outputs which are each the inverse of the other and provide the control signal, the first selection switch being controlled by the first output of the bistable circuit, and the second selection switch being controlled by the second output of the bistable circuit.

15. The circuit as claimed in claim 1, further comprising means for applying program pulses to control the turn on of the circuit, which program pulses comprise sequences of test pulses applied to the circuit blocks and to the test and control arrangement for testing each successive block and thereby to electronically program the test and control arrangement for each block so as to select which of the parallel circuit paths is used to provide outputs from the circuit blocks when turn on of the circuit is complete.

* * * * *